United States Patent
Itasaka et al.

(10) Patent No.: US 9,438,167 B2
(45) Date of Patent: *Sep. 6, 2016

(54) OSCILLATION CIRCUIT, OSCILLATOR, MANUFACTURING METHOD OF OSCILLATOR, ELECTRONIC DEVICE, AND MOVING OBJECT

(71) Applicant: Seiko Epson Corporation, Tokyo (JP)

(72) Inventors: Yosuke Itasaka, Tatsuno (JP);
Masayuki Ishikawa, Suwa (JP);
Takehiro Yamamoto, Suwa (JP);
Akihiro Fukuzawa, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/527,052

(22) Filed: Oct. 29, 2014

(65) Prior Publication Data

US 2015/0116044 A1    Apr. 30, 2015

(30) Foreign Application Priority Data

Oct. 30, 2013  (JP) .................................. 2013-225999

(51) Int. Cl.
*H03B 5/36*     (2006.01)
*H03L 1/00*     (2006.01)

(52) U.S. Cl.
CPC .............. *H03B 5/366* (2013.01); *H03B 5/362* (2013.01); *H03L 1/00* (2013.01); *Y10T 29/49007* (2015.01)

(58) Field of Classification Search
CPC ............ H03B 5/30; H03B 5/32; H03B 5/36; H03B 5/362; H03B 5/364; H03L 1/00

USPC .......... 327/143; 331/44, 65, 116 FE, 116 M, 331/116 R, 154, 158, 185, 186

See application file for complete search history.

(56) References Cited

U.S. PATENT DOCUMENTS

| | | | |
|---|---|---|---|
| 5,126,695 A * | 6/1992 | Abe ................................ 331/46 |
| 5,369,377 A * | 11/1994 | Benhamida ..................... 331/49 |
| 5,517,109 A * | 5/1996 | Albean et al. ............. 324/750.3 |
| 6,617,756 B1 | 9/2003 | Uchiyama |
| 6,621,362 B2 | 9/2003 | Momtaz et al. |
| 6,782,485 B2 * | 8/2004 | Takai ............................ 713/500 |
| 6,819,195 B1 | 11/2004 | Blanchard et al. |
| 7,129,624 B2 | 10/2006 | Umeki et al. |
| 7,221,234 B2 | 5/2007 | Chien |
| 7,259,638 B2 | 8/2007 | Takahashi |
| 7,463,097 B2 | 12/2008 | Costa et al. |

(Continued)

FOREIGN PATENT DOCUMENTS

JP    02-261210    10/1990
JP    7-046072 A    2/1995

(Continued)

*Primary Examiner* — Levi Gannon
(74) *Attorney, Agent, or Firm* — Harness, Dickey & Pierce, P.L.C.

(57) ABSTRACT

An oscillation circuit includes: an oscillation unit which includes a first terminal and a second terminal connected to a resonator, a third terminal, a fourth terminal to which at least one of a power supply potential and a signal for inspecting the resonator is applied, a first switching unit which switches modes of electrical connection between the first terminal and the third terminal, and a second switching unit which switches modes of electrical connection between the second terminal and the fourth terminal.

13 Claims, 8 Drawing Sheets

(56) References Cited

U.S. PATENT DOCUMENTS

| | | |
|---|---|---|
| 7,471,164 B2 | 12/2008 | Reimann |
| 7,646,257 B2 | 1/2010 | Gailus et al. |
| 7,714,674 B2 * | 5/2010 | Guo et al. .................. 331/176 |
| 7,768,357 B2 * | 8/2010 | Yamakawa ............ H03B 5/32 |
| | | 331/108 C |
| 7,795,982 B2 | 9/2010 | Yamamoto |
| 7,821,348 B2 | 10/2010 | Ishimaru et al. |
| 7,978,016 B2 | 7/2011 | Naito |
| 8,031,025 B2 | 10/2011 | Wang et al. |
| 8,143,961 B2 * | 3/2012 | Mastovich .................. 331/158 |
| 8,164,159 B1 | 4/2012 | Armstrong et al. |
| 8,253,506 B2 | 8/2012 | Liu et al. |
| 8,368,472 B2 | 2/2013 | Nakamura et al. |
| 8,461,934 B1 * | 6/2013 | Carnu et al. .................. 331/46 |
| 2002/0171499 A1 | 11/2002 | Momtaz et al. |
| 2003/0227341 A1 | 12/2003 | Sawada |
| 2004/0056725 A1 | 3/2004 | Kitamura et al. |
| 2006/0049878 A1 | 3/2006 | Kawabe et al. |
| 2007/0075798 A1 | 4/2007 | Amano |
| 2007/0132524 A1 | 6/2007 | Kishino |
| 2008/0001678 A1 | 1/2008 | Otsuka |
| 2008/0191756 A1 * | 8/2008 | Li et al. .................. 327/147 |
| 2009/0039970 A1 | 2/2009 | Shen et al. |
| 2009/0115542 A1 | 5/2009 | Nakamura et al. |
| 2009/0256449 A1 | 10/2009 | Nishimura et al. |
| 2010/0171557 A1 | 7/2010 | Tsukizawa |
| 2012/0126907 A1 | 5/2012 | Nakamoto et al. |
| 2012/0176763 A1 | 7/2012 | Asamura |
| 2013/0154754 A1 | 6/2013 | Frank |
| 2013/0257553 A1 | 10/2013 | Ishii |
| 2014/0132362 A1 * | 5/2014 | Hsiao .......................... 331/109 |
| 2014/0210565 A1 | 7/2014 | Vilas Boas et al. |
| 2015/0116051 A1 | 4/2015 | Terrovitis |

FOREIGN PATENT DOCUMENTS

| | | |
|---|---|---|
| JP | 07-249957 | 9/1995 |
| JP | 11-284484 A | 10/1999 |
| JP | 2000-278079 A | 10/2000 |
| JP | 2001-007648 A | 1/2001 |
| JP | 2001-094347 A | 4/2001 |
| JP | 2001-102870 A | 4/2001 |
| JP | 2002-299991 A | 10/2002 |
| JP | 2004-120293 A | 4/2004 |
| JP | 2004-214799 A | 7/2004 |
| JP | 2004-328505 A | 11/2004 |
| JP | 2005-051513 A | 2/2005 |
| JP | 2005-203858 A | 7/2005 |
| JP | 2009-044606 A | 2/2009 |
| JP | 2009-164691 A | 7/2009 |
| JP | 2009-201097 A | 9/2009 |
| JP | 2009-253883 A | 10/2009 |
| JP | 2010-050508 A | 3/2010 |
| JP | 2010-062959 A | 3/2010 |
| JP | 2010-074840 A | 4/2010 |
| JP | 2013-098678 A | 5/2013 |
| JP | 2013-207337 A | 10/2013 |
| JP | 2014-154994 A | 8/2014 |

* cited by examiner

OSCILLATION CIRCUIT, OSCILLATOR, MANUFACTURING METHOD OF OSCILLATOR, ELECTRONIC DEVICE, AND MOVING OBJECT

BACKGROUND

1. Technical Field

The present invention relates to an oscillation circuit, an oscillator, a manufacturing method of an oscillator, an electronic device, and a moving object.

2. Related Art

For a resonator such as a crystal resonator (piezoelectric resonator) or a resonator having a micro electromechanical systems (MEMS), it is necessary to inspect characteristics of the resonator by performing overdrive inspection by inspecting frequency characteristics of the resonator by applying an AC signal with high current, voltage, or power to drive the resonator, or drive level inspection by inspecting fluctuation of frequency characteristics of the resonator by applying a signal obtained by gradually increasing or decreasing a frequency of an AC signal with high current, voltage, or power to drive the resonator.

Meanwhile, an oscillator in which a crystal resonator and an oscillation circuit are accommodated in the same accommodation container has been developed, in order to provide a miniaturized oscillator. Accordingly, various investigations are performed in order to inspect characteristics of the resonator, after mounting the crystal resonator and the oscillation circuit in the same accommodation container.

JP-A-2001-102870 discloses a crystal oscillator that includes an analog switch which is controlled by applying a specified DC voltage to an inspecting terminal dedicated to inspection used when inspecting characteristics of a crystal resonator and a power input terminal, in which the crystal resonator is electrically connected to the inspecting terminal through the analog switch when inspecting the crystal resonator, and the inspecting terminal is separated from the crystal resonator when normally operating the oscillator.

In addition, JP-A-2009-201097 discloses a crystal oscillator which uses a function terminal of the oscillator as an inspecting terminal of a crystal resonator.

In JP-A-2009-201097, the inspecting terminal of the crystal resonator is commonly used as an output terminal and a standby terminal of the crystal oscillator, and accordingly it is possible to miniaturize the oscillator compared to a configuration of including the dedicated inspecting terminal as disclosed in JP-A-2001-102870.

In JP-A-2009-201097, the output terminal and the standby terminal are selected as terminals to be used with the inspecting terminal of the crystal resonator, and this is because a switching circuit is controlled with a power supply voltage when inspecting characteristics of the crystal resonator.

It is necessary to apply a potential with high stability to a power supply terminal and an earth terminal, in order to stabilize an operation of the switching circuit. If such terminals are used as the crystal inspection terminal, a signal of the crystal resonator may be superposed with a DC voltage, and accordingly the power supply voltage may be unstable. Therefore, the two terminals of the crystal resonator are limited to the output terminal and the standby terminal.

In both JP-A-2001-102870 and JP-A-2009-201097, when performing the inspection of the resonator, the power supply terminal and the earth terminal are necessary for controlling the analog switch and the switching circuit, in addition to two crystal inspection terminals which are connected to the resonator, and thus, it is necessary to manage the connection of electrodes and probes electrically connected to the four terminals. As there are a great number of connection portions to be managed, a possibility of occurrence of inspection malfunction due to connection failure increases, and reliability in the inspection of the resonator may be decreased.

SUMMARY

An advantage of some aspects of the invention is to provide an oscillation circuit, an oscillator, a manufacturing method of an oscillator, an electronic device, and a moving object which can increase the reliability of inspection of a resonator.

Application Example 1

This application example is directed to an oscillation circuit including: an oscillation unit which includes a first terminal and a second terminal connected to a resonator; a third terminal; a fourth terminal to which at least one of a power supply potential and an AC signal for driving the resonator is applied; a first switching unit which switches modes of electrical connection between the first terminal and the third terminal; and a second switching unit which switches modes of electrical connection between the second terminal and the fourth terminal.

According to this application example, it is possible to perform the inspection of the characteristics of the resonator such as the overdrive inspection or the drive level inspection, for example, by supplying the AC signal for driving the resonator, for example, as a voltage signal for inspecting the resonator between the third terminal and the fourth terminal. At the time of the normal operation of the oscillation circuit and the inspection of the resonator, the fourth terminal can be commonly used as a terminal to which the power supply potential is supplied and a terminal to which a voltage signal for inspecting the resonator is supplied, and accordingly it is possible to reduce the number of terminals used in the inspection, compared to a case of providing an inspecting terminal dedicated to the inspection, for example. Thus, it is possible to reduce the possibility of occurrence of inspection malfunction due to failure in the electrical connection between a probe for inputting an inspecting signal and a terminal on the oscillation circuit side, and therefore, it is possible to realize the oscillation circuit with improved reliability in the inspection of the resonator. In addition, it is possible to supply a voltage signal for inspecting the characteristics of the resonator to the resonator through the third terminal and the fourth terminal, not using the oscillation unit, and accordingly limitation regarding a magnitude of the voltage signal is reduced, compared to a case of supplying the voltage signal to the resonator through the oscillation unit. Since the terminal dedicated to the inspection is commonly used with the terminal used at the time of the normal operation, it is possible to reduce the number of terminals and to miniaturize the oscillation circuit.

Application Example 2

In the oscillation circuit according to the application example described above, it is preferable that the third terminal is a terminal connected to an earth potential.

A wire connected to the third terminal connected to the earth potential is generally designed to be thick, and it is common not to dispose an element other than the first switching unit between the third terminal and the first terminal. Accordingly, there are few resistance components other than the first switching unit between the third terminal and the first terminal. In the same manner as described above, a wire connected to the fourth terminal to which the power supply potential is supplied is generally designed to be thick, and it is common not to dispose an element other than the second switching unit between the fourth terminal and the second terminal. Accordingly, there are few resistance components other than the second switching unit between the fourth terminal and the second terminal. Therefore, according to this application example, it is possible to reduce the amplitude of the voltage signal supplied between the third terminal and the fourth terminal, when performing the inspection of the characteristics of the resonator such as overdrive inspection or drive level inspection.

Application Example 3

In the oscillation circuit according to the application example described above, it is preferable that the first switching unit is a circuit including a function of protecting the oscillation unit from a voltage higher than a maximum voltage applied to the first terminal in a state where the oscillation unit is operated.

According to this application example, since the first switching unit can be commonly used with a circuit having a function of protecting the oscillation unit from a voltage higher than the maximum voltage applied to the first terminal in a state where the oscillation unit is operated, such as static electricity, it is possible to reduce a circuit size, compared to a case of separately providing a dedicated switch as the first switching unit and a circuit for static electricity protection. Therefore, it is possible to realize the oscillation circuit which can be miniaturized.

Application Example 4

In the oscillation circuit according to the application example described above, it is preferable that the second switching unit is a circuit including a function of protecting the oscillation unit from a voltage higher than a maximum voltage applied to the second terminal in a state where the oscillation unit is operated.

According to this application example, since the second switching unit can be commonly used with a circuit having a function of protecting the oscillation unit from a voltage higher than the maximum voltage applied to the second terminal in a state where the oscillation unit is operated, such as static electricity, it is possible to reduce a circuit size, compared to a case of separately providing a dedicated switch as the second switching unit and a circuit for static electricity protection. Therefore, it is possible to realize the oscillation circuit which can be miniaturized.

Application Example 5

In the oscillation circuit according to the application example described above, it is preferable that the first terminal is electrically connected to an input terminal side of the oscillation unit.

According to this application example, since a fixed potential such as the earth potential can be connected to the input terminal side of the oscillation unit through the first terminal, for example, it is easy to stop the operation of the oscillation unit at the time of inspection of the resonator.

Accordingly, since the magnitude of the signal which is generated from the oscillation unit at the time of inspection of the resonator and is applied to the resonator is reduced, it is possible to realize the oscillation circuit with improved reliability in the inspection of the resonator. It is possible to realize the oscillation circuit with less concern regarding degradation of the oscillation unit, even when an inspection signal of the resonator is applied.

Application Example 6

In the oscillation circuit according to the application example described above, it is preferable that the first switching unit includes a transistor.

According to this application example, it is possible to easily control the electrical connection between the first terminal and the third terminal connected to the earth potential, by using the transistor as a switching circuit, for example. In addition, it is possible to perform the inspection of the resonator by using the two terminals which are the third terminal and the fourth terminal which is electrically connected to the second terminal and to which the power supply potential is supplied. Thus, it is possible to reduce the possibility of occurrence of inspection malfunction due to failure in the electrical connection between the first terminal and the third terminal and to inspect the resonator with the small number of terminals, and therefore, it is possible to realize the oscillation circuit with improved reliability in the inspection of the resonator.

Application Example 7

In the oscillation circuit according to the application example described above, it is preferable that the second switching unit includes a transistor.

According to this application example, it is possible to easily control the electrical connection between the second terminal and the fourth terminal to which the power supply potential is supplied, by using the transistor as a switching circuit, for example. In addition, it is possible to perform the inspection of the resonator by using the two terminals which are the third terminal which is electrically connected to the first terminal and is connected to the earth potential, and the fourth terminal. Thus, it is possible to reduce the possibility of occurrence of inspection malfunction due to failure in the electrical connection between the second terminal and the fourth terminal and to inspect the resonator with the small number of terminals, and therefore, it is possible to realize the oscillation circuit with improved reliability in the inspection of the resonator.

Application Example 8

In the oscillation circuit according to the application example described above, it is preferable that the oscillation circuit further includes a control unit which controls the first switching unit and the second switching unit, the first switching unit and the second switching unit have a first mode in which the first switching unit is controlled so that the first terminal and the third terminal are electrically connected to each other and the second switching unit is controlled so that the second terminal and the fourth terminal are electrically connected to each other, and a second mode in which the first switching unit is controlled so that the first terminal and the third terminal are not electrically connected to each other and the second switching unit is controlled so that the second terminal and the fourth terminal are not electrically connected to each other, and the control unit switches the mode from the second mode to the first mode, based on a clock signal input in a period in which the supplied power supply potential is equal to or greater than a reference value.

According to this application example, since the control unit performs switching of the mode based on the two signals of the magnitude of the power supply potential and the clock signal, the mode is not switched by only the fluctuation of the power supply potential, and accordingly, it is possible to reduce the possibility of the malfunction of unintentionally switching the mode.

Application Example 9

This application example is directed to an oscillation circuit including: an oscillation section which uses a resonator as a frequency source and includes a feedback conduction path between the resonator and the oscillation section; and an impedance control section which controls an impedance between a path through which a signal is input from the oscillation section to the resonator and a power conduction path, in which the power conduction path is a path through which an AC voltage for driving the resonator is applied.

According to this application example, by supplying the AC voltage for driving the resonator, for example, as the voltage signal for inspecting characteristics of the resonator to the power conduction path, and by controlling an impedance between the path through which a signal passes from the oscillation section to the resonator and the power conduction path to be decreased by the impedance control section, it is possible to perform inspection of the characteristics of the resonator such as the overdrive inspection or the drive level inspection. At the time of the normal operation of the oscillation circuit and the inspection of the resonator, the power conduction path can be commonly used with a conduction path for supplying the voltage signal for inspecting the characteristics of the resonator, and accordingly it is possible to reduce the number of terminals used in the inspection, compared to a case of providing an inspecting terminal dedicated to the inspection, for example. Thus, it is possible to reduce the possibility of occurrence of inspection malfunction due to failure in the electrical connection between a probe for inputting an inspecting signal and a terminal on the oscillation circuit side, and therefore, it is possible to realize the oscillation circuit with improved reliability in the inspection of the resonator. In addition, it is possible to supply a voltage signal for inspecting the characteristics of the resonator to the resonator through the power conduction path and the impedance control section, not using the oscillation section, and accordingly, limitation regarding the magnitude of the voltage signal is reduced, compared to a case of supplying the voltage signal to the resonator through the oscillation section. It is possible to realize the oscillation circuit with less concern regarding degradation of the oscillation unit, even when an inspection signal of the resonator is applied.

Application Example 10

This application example is directed to an oscillator including: any of the oscillation circuits according to the application examples; and a resonator.

Application Example 11

In the oscillator according to the application example described above, it is preferable that the oscillator further includes a package which accommodates the oscillation circuit and the resonator.

According to this application example, since the oscillation circuit with improved reliability in the inspection of the resonator is provided, it is possible to realize the oscillator with improved reliability in the inspection of the resonator.

Application Example 12

This application example is directed to a manufacturing method of an oscillator, including: preparing a configuration of including an oscillation circuit including an oscillation unit which includes a first terminal and a second terminal connected to a resonator, a third terminal, a fourth terminal to which a power supply potential is applied, a first switching unit which switches modes of electrical connection between the first terminal and the third terminal, and a second switching unit that switches modes of electrical connection between the second terminal and the fourth terminal, and a resonator, in which the oscillation circuit and the resonator are electrically connected to each other, the first switching unit is switched so as to electrically connect the first terminal and the third terminal to each other, and the second switching unit is switched so as to electrically connect the second terminal and the fourth terminal to each other; applying an AC voltage to the third terminal and the fourth terminal; and switching the first switching unit so as not to electrically connect the first terminal and the third terminal to each other, and switching the second switching unit so as not to electrically connect the second terminal and the fourth terminal to each other.

According to this application example, by supplying the voltage signal for inspecting the resonator, for example, as the AC voltage, between the third terminal and the fourth terminal, it is possible to perform the inspection of the characteristics of the resonator such as overdrive inspection or drive level inspection. At the time of the normal operation of the oscillation circuit and the inspection of the resonator, the fourth terminal can be commonly used as a terminal to which the power supply potential is supplied and a terminal to which a voltage signal for inspecting the resonator is supplied, and accordingly it is possible to reduce the number of terminals used in the inspection, compared to a case of providing an inspecting terminal dedicated to the inspection, for example. Thus, it is possible to reduce the possibility of occurrence of inspection malfunction due to failure in the electrical connection between a probe for inputting an inspecting signal and a terminal on the oscillation circuit side, and therefore, it is possible to realize the manufacturing method of the oscillator with improved reliability in the inspection of the resonator.

Application Example 13

In the manufacturing method of an oscillator according to the application example described above, it is preferable that the AC voltage applied to the third terminal and the fourth terminal is at least one of a voltage for overdrive inspection and a voltage for drive level inspection.

According to this application example, since at least one of the overdrive inspection and the drive level inspection is performed as the inspection of the resonator, it is possible to determine that the oscillator confirmed as a good product in the inspection of the resonator is a good product. Accordingly, it is possible to manufacture the oscillator with high reliability.

Application Example 14

This application example is directed to an electronic device including any of the oscillation circuits according to the application examples described above or any of the oscillators according to the application examples described above.

Application Example 15

This application example is directed to a moving object including any of the oscillation circuits according to the application examples described above or any of the oscillators according to the application examples described above.

According to this application example, since the oscillation circuit or the oscillator with improved reliability in the inspection of the resonator is included, it is possible to realize the electronic device and the moving object with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferable embodiments of the invention will be described in detail with reference to the drawings. The accompanying drawings are provided for convenience of description. Examples which will be described later do not limit the content of the invention disclosed in aspects. The entirety of the configurations which will be described later are not limited to essential constituent elements of the invention.

1. Oscillation Circuit According to First Embodiment

Figure 1:
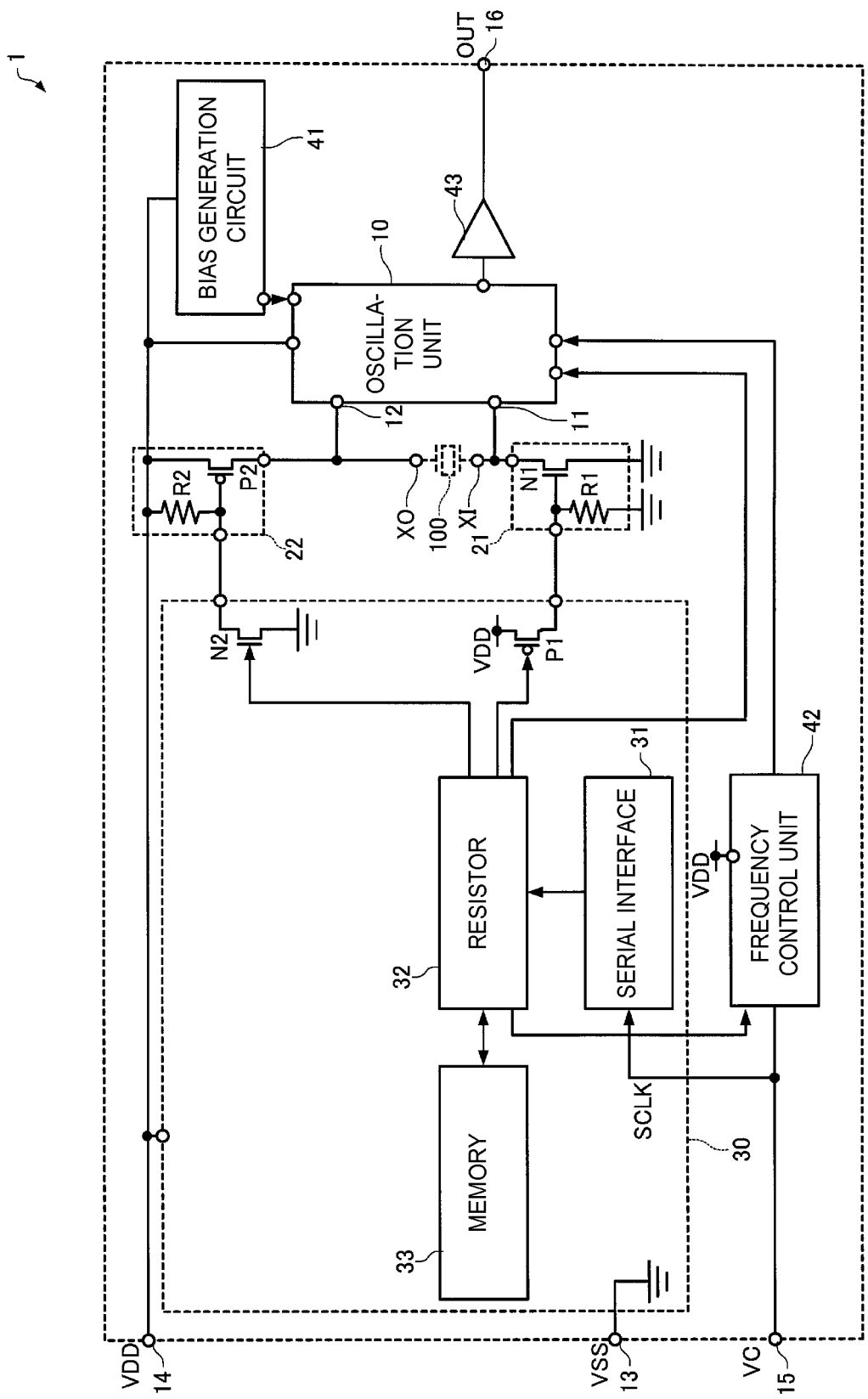
FIG. 1 is a circuit diagram of an oscillation circuit according to a first embodiment.

FIG. 1 is a circuit diagram of an oscillation circuit 1 according to a first embodiment. A part or an entirety of the oscillation circuit 1 may be configured with a semiconductor device. The oscillation circuit 1 according to the first embodiment as an example of the invention has a configuration of not including the resonator 100, but the resonator 100 may be included in the oscillation circuit 1.

The oscillation circuit 1 according to the embodiment includes an oscillation section which uses a resonator 100 as a frequency source and includes a feedback conduction path between the resonator 100 and the oscillation section, and an impedance control section which controls an impedance between a path through which a signal is input from the oscillation section to the resonator 100 and a power conduction path.

More specifically, the oscillation circuit 1 includes an oscillation unit 10 which includes a first terminal 11 to which a signal from the resonator 100 is supplied and a second terminal 12 to which a signal supplied to the resonator 100 is output, a third terminal 13, a fourth terminal 14 to which a power supply potential VDD is supplied, a first switching unit 21 which controls an electrical connection state between the first terminal 11 and the third terminal 13, and a second switching unit 22 which controls an electrical connection state between the second terminal 12 and the fourth terminal 14. Functions of the oscillation section described above are mainly realized by the oscillation unit 10. Functions of the signal applying section described above are mainly realized by the second terminal 12 and the fourth terminal 14. The impedance control section described above is mainly realized by the second switching unit 22. In the example shown in FIG. 1, the oscillation circuit 1 further includes a control unit 30 which controls the first switching unit 21 and a second switching unit 22, a fifth terminal 15 to which a control signal for frequency control is input, and a sixth terminal 16 to which an oscillation signal is output.

The oscillation unit 10 is electrically connected to the resonator 100 and performs an oscillation operation. As the oscillation unit 10, various well-known oscillation circuits such as a pierce oscillation circuit, an inverter-type oscillation circuit, a Colpitts oscillation circuit, and a Hartley oscillation circuit can be used. In the embodiment, the oscillation unit 10 is a pierce oscillation circuit. In the embodiment, the oscillation unit 10 is configured with a bias generation circuit 41, a frequency control unit 42, and an output buffer 43.

Figure 2:
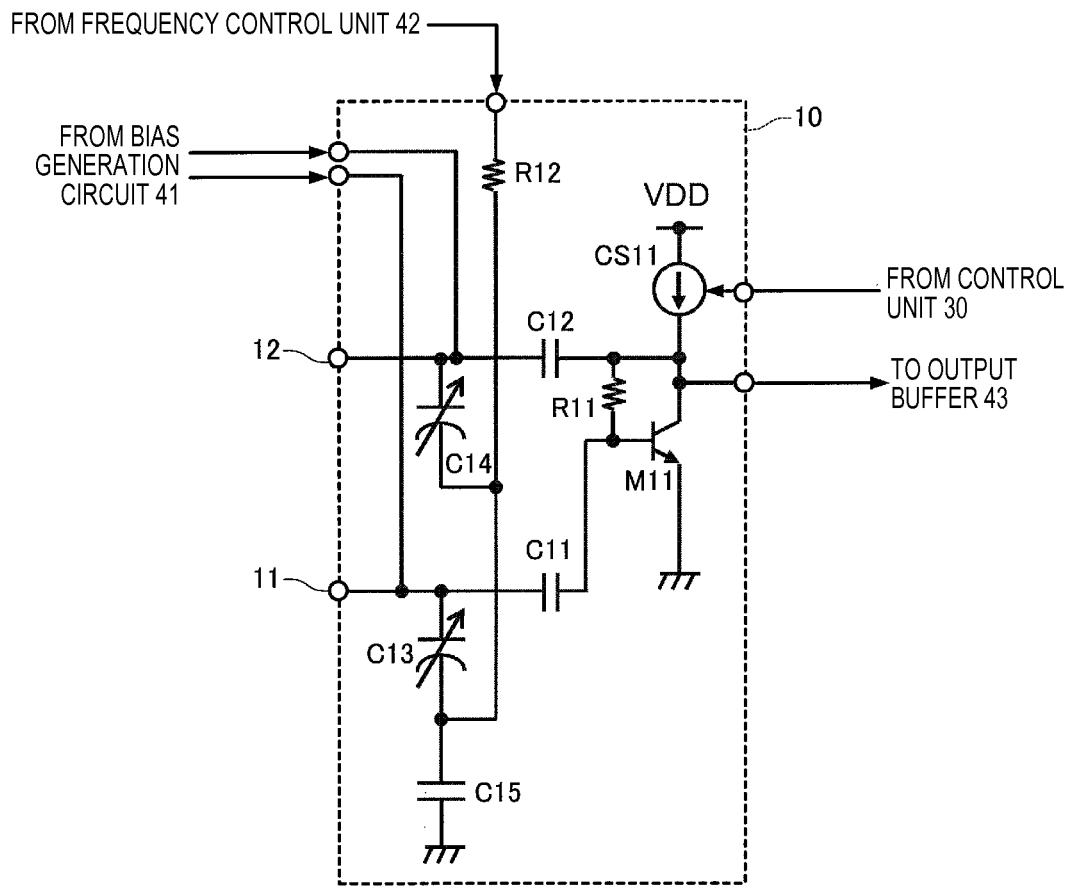
FIG. 2 is a circuit diagram showing an example of a configuration of an oscillation unit.

FIG. 2 is a circuit diagram showing an example of a configuration of the oscillation unit 10. In the example shown in FIG. 2, the oscillation unit 10 includes a transistor M11, capacitors C11 to C15, resistors R11 to R12, and a current source CS11. The capacitor C11 and the capacitor C12 are DC cut capacitances. The capacitor C13 and the capacitor C14 are variable capacitances for frequency controlling. By providing the capacitor C11 and the capacitor C12, it is possible to control a bias voltage applied to the capacitor C13 and the capacitor C14 which are variable capacitances for frequency controlling to be separated from the transistor M11 and the like. In addition, when performing inspection of characteristics of the resonator 100 such as overdrive inspection or drive level inspection, it is possible to reduce a risk of a through current flowing into the transistor M11.

The first terminal 11 and a base of the transistor M11 are connected to each other through the capacitor C11. The second terminal 12 and a collector of the transistor M11 are connected to each other through the capacitor C12. The base and the collector of the transistor M11 are connected to each other through the resistor R11. The collector of the transistor M11 and the power supply potential VDD are connected to each other through the current source CS11. The collector of the transistor M11 is connected to an input terminal of the output buffer 43. An emitter of the transistor M11 is connected to an earth potential VSS. The capacitor C13 and the capacitor C15 are connected in series, with one end (one terminal) of the capacitor C13 connected to the first terminal 11, and one end (the other terminal) of the capacitor C15 connected to the earth potential VSS. One end of the capacitor C14 is connected to the second terminal 12. The other end of the capacitor C14 is connected to a common connection portion of the capacitor C13 and the capacitor C15, and is connected to an output terminal of the frequency control unit 42 through the resistor R12. A bias voltage output by the bias generation circuit 41 is supplied to one end of the capacitor C13 and one end of the capacitor C14.

Figure 3:
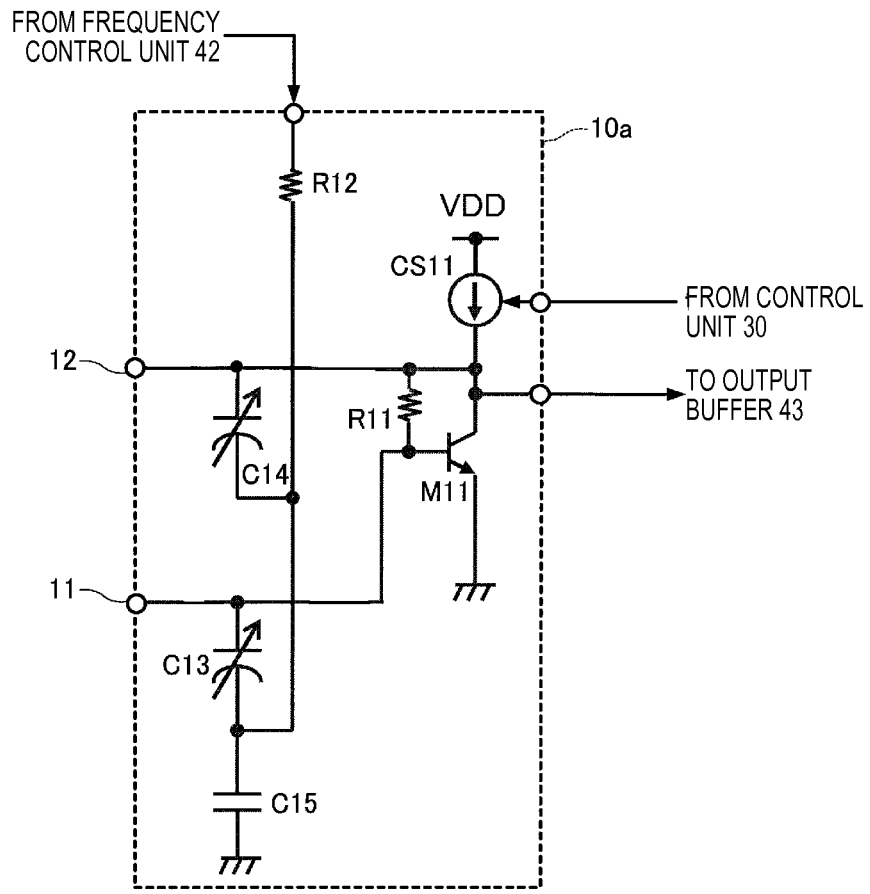
FIG. 3 is a circuit diagram showing an example of a configuration of an oscillation unit which is a modification example of an oscillation unit of FIG. 2.

FIG. 3 is a circuit diagram showing an example of a configuration of an oscillation unit 10a which is a modification example of the oscillation unit 10. The oscillation unit 10a has a configuration of the oscillation unit 10 excluding the capacitor C11 and the capacitor C12 which are DC cut capacitances. Accordingly, a configuration of receiving supply of a bias voltage from the bias generation circuit 41 is also excluded. The other configurations are the same as those of the oscillation unit 10.

In the oscillation unit 10 shown in FIG. 2 and the oscillation unit 10a shown in FIG. 3, an input terminal side is set as the first terminal 11 and an output terminal side is set as the second terminal 12, but an input terminal side can be set as the second terminal 12 and an output terminal side can be set as the first terminal 11.

Returning to FIG. 1, the bias generation circuit 41 generates a bias voltage and supplies the bias voltage to the oscillation unit 10, based on power supplied from the fourth terminal 14. In the embodiment, the bias voltage is supplied to the capacitor C13 and the capacitor C14 of the oscillation unit 10.

The frequency control unit 42 controls variable capacitances (capacitor C13 and the capacitor C14 of FIG. 2) included in the oscillation unit 10 based on a control signal input to the fifth terminal 15. That is, in the example shown in FIG. 1, the fifth terminal 15 also functions as a terminal for frequency controlling. Accordingly, it is possible to control an oscillation frequency of the oscillation unit 10. The frequency control unit 42 may include an amplification circuit which amplifies a control signal input to the fourth terminal 14 and outputs the control signal to the oscillation unit 10.

The output buffer 43 is configured with the amplification circuit. The oscillation signal output by the oscillation unit 10 is input to the output buffer 43, and the output buffer outputs the signal to the sixth terminal 16.

The first switching unit 21 controls an electrical connection state between the first terminal 11 and the third terminal 13 of the oscillation unit 10. In the example shown in FIG. 1, the first switching unit 21 controls the electrical connection state (amount of impedance) between the first terminal 11 and the third terminal 13, so as to control the size of an AC signal to be supplied from the first terminal 11 to the third terminal 13 through wires (earth wires in FIG. 1), based on the control signal output by the control unit 30. The first switching unit 21 may, for example, include a switch connected between the first terminal 11 to the third terminal 13 as an element which controls the amount of impedance between the first terminal 11 to the third terminal 13. In the example shown in FIG. 1, an NMOS transistor N1 functions as the switch.

In the example shown in FIG. 1, the third terminal 13 connected to the first switching unit 21 is a terminal connected to the earth potential VSS, but the other function terminal (terminal for frequency control or an output terminal of the oscillation signal) or a dedicated terminal can be used as the third terminal 13.

The second switching unit 22 controls an electrical connection state between the second terminal 12 and the fourth terminal 14 of the oscillation unit 10. In the example shown in FIG. 1, the second switching unit 22 controls the electrical connection state (amount of impedance) between the second terminal 12 and the fourth terminal 14, so as to control the size of an AC signal to be output from the second terminal 12 to the fourth terminal 14 through wires (earth wires in FIG. 1), based on the control signal output by the control unit 30. The second switching unit 22 may, for example, include a switch connected between the second terminal 12 and the fourth terminal 14 as an element which controls the amount of impedance between the second terminal 12 and the fourth terminal 14. In the example shown in FIG. 1, a PMOS transistor P1 functions as the switch.

According to the oscillation circuit 1 of the embodiment, by supplying a voltage signal (one example of an AC voltage for driving the resonator) for inspecting characteristics of the resonator 100 to the power conduction path, and by controlling an impedance between the path through which a signal passes from the oscillation section to the resonator 100 and the power conduction path to be decreased by the impedance control section, it is possible to perform inspection of the characteristics of the resonator 100 such as the overdrive inspection (test of applying an AC signal to the resonator 100 to perform strong excitation of the resonator 100), drive level inspection (frequency stability test when a drive level of the AC signal is changed in a normal use area), or frequency adjustment of the resonator 100 (performing adjustment of the resonator 100 by measuring a resonance frequency of the resonator 100 and setting the measured resonance frequency to a desired resonance frequency). At the time of the normal operation of the oscillation circuit 1 and the inspection of the resonator 100, the power conduction path can be commonly used with a conduction path for supplying the voltage signal for inspecting the characteristics of the resonator 100, and accordingly it is possible to reduce the number of terminals used in the inspection, compared to a case of providing an inspecting terminal dedicated to the inspection, for example. Thus, it is possible to reduce the possibility of occurrence of inspection malfunction due to failure in the electrical connection between a probe for inputting an inspecting signal and a terminal on the oscillation circuit 1 side, and therefore, it is possible to realize the oscillation circuit 1 with improved reliability in the inspection of the resonator 100. In addition, it is possible to supply a voltage signal for inspecting the characteristics of the resonator 100 to the resonator 100 through the power conduction path and the impedance control section, not using the oscillation section, and accordingly, limitation regarding the magnitude of the voltage signal is reduced, compared to a case of supplying the voltage signal to the resonator 100 through the oscillation section. It is possible to realize the oscillation circuit 1 with less concern regarding degradation of the oscillation unit 10, even when an inspection signal of the resonator 100 is applied.

More specifically, according to the oscillation circuit 1 of the embodiment, it is possible to perform the inspection of the characteristics of the resonator 100 such as the overdrive inspection or the drive level inspection, for example, by supplying the voltage signal (one example of AC voltage for driving the resonator 100) for inspecting the resonator 100 between the third terminal 13 and the fourth terminal 14, for example. At the time of the normal operation of the oscillation circuit 1 and the inspection of the resonator 100, the fourth terminal 14 can be commonly used as a terminal to which the power supply potential VDD is supplied and a terminal to which a voltage signal for inspecting the resonator 100 is supplied, and accordingly it is possible to reduce the number of terminals used in the inspection, compared to the case of providing an inspecting terminal dedicated to the inspection, for example. Thus, it is possible to reduce the possibility of occurrence of inspection malfunction due to failure in the electrical connection between a probe for inputting an inspecting signal and a terminal on the oscillation circuit 1 side, and therefore, it is possible to realize the oscillation circuit 1 with improved reliability in the inspection of the resonator 100. In addition, it is possible to supply a voltage signal for inspecting the characteristics of the resonator 100 to the resonator 100 through the third terminal 13 and the fourth terminal 14, not using the oscillation unit 10, and accordingly limitation regarding a magnitude of the voltage signal is reduced, compared to a case of supplying the voltage signal to the resonator 100 through the oscillation unit 10. Since the terminal dedicated to the inspection is commonly used with the terminal used at the time of the normal operation, it is possible to reduce the number of terminals and to miniaturize the oscillation circuit 1.

As shown in FIG. 1, it is preferable that the third terminal 13 be a terminal connected to the earth potential VSS.

A wire connected to the third terminal 13 connected to the earth potential VSS is generally designed to be thick, and it is common not to dispose an element other than the first switching unit 21 between the third terminal 13 and the first terminal 11. Accordingly, there are few resistance components other than the first switching unit 21 between the third terminal 13 and the first terminal 11. In the same manner as described above, a wire connected to the fourth terminal 14 to which the power supply potential VDD is supplied is generally designed to be thick, and it is common not to dispose an element other than the second switching unit 22 between the fourth terminal 14 and the second terminal 12. Accordingly, there are few resistance components other than the second switching unit 22 between the fourth terminal 14 and the second terminal 12. Therefore, according to the embodiment, it is possible to reduce the amplitude of the voltage signal supplied between the third terminal 13 and the fourth terminal 14, when performing the inspection of the characteristics of the resonator 100 such as overdrive inspection or drive level inspection.

As shown in FIG. 1, the first switching unit 21 may be a circuit (electrostatic discharge protection circuit, which is one example of a circuit which protects the oscillation unit 10 from a voltage higher than the maximum voltage applied to the first terminal 11 in a state where the oscillation unit 10 is operated) having a function of protecting the oscillation unit 10 from static electricity. In the example shown in FIG. 1, the first switching unit 21 includes the NMOS transistor N1 and the resistor R1, and functions as an electrostatic discharge protection circuit with respect to the oscillation unit 10 or the resonator 100 on the first terminal 11 side.

A drain of the NMOS transistor N1 is connected to the first terminal 11 and a source thereof is connected to the earth potential VSS. One end (one terminal) of the resistor R1 is connected to a gate of the NMOS transistor N1 and the other end (other terminal) thereof is connected to the earth potential VSS. The control signal from the control unit 30 is input to the gate of the NMOS transistor N1, and the NMOS transistor N1 switches between an ON state and an OFF state based on the input control signal.

According to the oscillation circuit 1 of the embodiment, since the first switching unit 21 can be commonly used with a circuit having a function of protecting the oscillation unit 10 from static electricity, it is possible to reduce a circuit size, compared to a case of separately providing a dedicated switch as the first switching unit 21 and a circuit for static electricity protection. Therefore, it is possible to realize the oscillation circuit 1 which can be miniaturized.

As shown in FIG. 1, the second switching unit 22 may be a circuit (electrostatic discharge protection circuit, which is one example of a circuit which protects the oscillation unit 10 from a voltage higher than the maximum voltage applied to the second terminal 12 in a state where the oscillation unit 10 is operated) having a function of protecting the oscillation unit 10 from static electricity. In the example shown in FIG. 1, the second switching unit 22 includes the PMOS transistor P2 and the resistor R2, and functions as an electrostatic discharge protection circuit of the oscillation unit 10 or the resonator 100 on the second terminal 12 side.

A drain of the PMOS transistor P2 is connected to the second terminal 12 and a source thereof is connected to the power supply potential VDD. One end (one terminal) of the resistor R2 is connected to a gate of the PMOS transistor P2 and the other end (other terminal) thereof is connected to the power supply potential VDD. The control signal from the control unit 30 is input to the gate of the PMOS transistor P2, and the PMOS transistor P2 switches between an ON state and an OFF state based on the input control signal.

According to the oscillation circuit 1 of the embodiment, since the second switching unit 22 can be commonly used with a circuit having a function of protecting the oscillation unit 10 from static electricity, and it is possible to reduce a circuit size, compared to a case of separately providing a dedicated switch as the second switching unit 22 and a circuit for static electricity protection. Therefore, it is possible to realize the oscillation circuit 1 which can be miniaturized.

As shown in FIGS. 1 and 2, the first terminal 11 may be electrically connected to an input terminal side of the oscillation unit 10. In addition, as shown in FIGS. 1 and 2, the second terminal 12 may be electrically connected to an output terminal side of the oscillation unit 10.

According to the oscillation circuit 1 of the embodiment, since a fixed potential such as the earth potential VSS can be connected to the input terminal side of the oscillation unit 10 through the first terminal 11, for example, it is easy to stop the operation of the oscillation unit 10 at the time of inspection of the resonator 100. Accordingly, since the magnitude of the signal which is generated from the oscillation unit 10 at the time of inspection of the resonator 100 and is applied to the resonator 100 is reduced, it is possible to realize the oscillation circuit 1 with improved reliability in the inspection of the resonator 100. It is possible to realize the oscillation circuit 1 with less concern regarding degradation of the oscillation unit 10, even when an inspection signal of the resonator 100 is applied.

As shown in FIG. 1, the first switching unit 21 may include a transistor. In the example shown in FIG. 1, the first switching unit 21 includes the NMOS transistor N1.

According to the oscillation circuit 1 of the embodiment, it is possible to easily control the electrical connection between the first terminal 11 and the third terminal 13 connected to the earth potential VSS, by using the NMOS transistor N1 as a switching circuit, for example. In addition, it is possible to perform the inspection of the resonator 100 by using the two terminals which are the third terminal 13 and the fourth terminal 14 which is electrically connected to the second terminal 12 and to which the power supply potential VDD is supplied. Thus, it is possible to reduce the possibility of occurrence of inspection malfunction due to failure in the electrical connection between the first terminal 11 and the third terminal 13 and to inspect the resonator 100 with the small number of terminals, and therefore, it is possible to realize the oscillation circuit 1 with improved reliability in the inspection of the vibrator 100.

As shown in FIG. 1, the second switching unit 22 may include a transistor. In the example shown in FIG. 1, the second switching unit 22 includes the PMOS transistor P1.

According to the oscillation circuit 1 of the embodiment, it is possible to easily control the electrical connection between the second terminal 12 and the fourth terminal 14 to which the power supply potential VDD is supplied by using the PMOS transistor P1 as a switching circuit. In addition, it is possible to perform the inspection of the resonator 100 by using the two terminals which are the third terminal 13 which is electrically connected to the first terminal 11 and is connected to the earth potential VSS, and the fourth terminal 14. Thus, it is possible to reduce the possibility of occurrence of inspection malfunction due to failure in the electrical connection between the second terminal 12 and the fourth terminal 14 and to inspect the resonator 100 with the small number of terminals, and therefore, it is possible to realize the oscillation circuit 1 with improved reliability in the inspection of the resonator 100.

As shown in FIG. 1, the oscillation circuit 1 may further include the control unit 30 which controls the first switching unit 21 and the second switching unit 22, the first switching unit 21 and the second switching unit 22 may have a first mode in which the first switching unit 21 is controlled so that the first terminal 11 and the third terminal 13 are electrically connected to each other and the second switching unit 22 is controlled so that the second terminal 12 and the fourth terminal 14 are electrically connected to each other, and a second mode in which the first switching unit 21 is controlled so that the first terminal 11 and the third terminal 13 are not electrically connected to each other and the second switching unit 22 is controlled so that the second terminal 12 and the fourth terminal 14 are not electrically connected to each other, and the control unit may switch the mode from the second mode to the first mode, based on the clock signal SCLK input in a period in which the supplied power supply potential VDD is equal to or greater than a reference value Vt.

In the example shown in FIG. 1, the control unit 30 includes a serial interface 31, a resistor 32, a memory 33, the PMOS transistor P1, and an NMOS transistor N2.

The serial interface 31 receives the supply of the power supply potential VDD and input of the clock signal SCLK, and controls the resistor 32 and the memory 33 based on the input clock signal SCLK. In the embodiment, the clock signal SCLK is input from the fifth terminal 15. In the embodiment, the serial interface 31 includes a resistor writing mode in which data is written in the resistor 32, and a memory writing mode in which data is written in the resistor 32 and the memory 33. The serial interface 31 may include a memory reading mode for reading out data in at least one of the resistor 32 and the memory 33 in order to output the data to the fifth terminal 15.

The resistor 32 stores data for controlling the first switching unit 21, the second switching unit 22, the frequency control unit 42, and the oscillation unit 10, and controls the first switching unit 21, the second switching unit 22, the frequency control unit 42, and the oscillation unit 10 based on the stored data. When applying an electrical current to the oscillation circuit 1, the resistor 32 writes and stores the data stored in the memory 33, and stores new data written by the serial interface 31 when new data is written by the serial interface 31.

The memory 33 stores data stored in the resistor 32 when applying an electrical current to the oscillation circuit 1. The memory 33 may, for example, be configured with various examples of well-known nonvolatile memory such as a rewritable nonvolatile memory including an electrically erasable programmable read-only memory (EEPROM), a flash memory, or a floating gate avalanche injection metal oxide semiconductor (FAMOS) memory which is not electrically rewritable but erasable by emitting an ultraviolet ray, or a non-rewritable nonvolatile memory such as a mask read-only memory (ROM). The FAMOS memory has a system of accumulating a charge on a floating gate by avalanche implantation, and this kind of memory is a nonvolatile memory used as a one-time programmable memory (OTP).

A drain of the PMOS transistor P1 is connected to the power supply potential VDD, a source thereof is connected to the gate of the NMOS transistor N1 of the first switching unit 21, and the control signal from the resistor 32 is input to a gate thereof. The PMOS transistor P1 outputs the control signal to the gate of the NMOS transistor N1 of the first switching unit 21.

A drain of the NMOS transistor N2 is connected to the earth potential VSS, a source thereof is connected to the gate of the PMOS transistor P2 of the second switching unit 22, and the control signal from the resistor 32 is input to a gate thereof. The NMOS transistor N2 outputs the control signal to the gate of the PMOS transistor P2 of the second switching unit 22.

In the first mode, the control unit 30 controls the first switching unit 21 so as to set an electrical connection state between the first terminal 11 and the third terminal 13 to the ON state. In addition, in the first mode, the control unit 30 controls the second switching unit 22 so as to set an electrical connection state between the second terminal 12 and the fourth terminal 14 to the ON state. Further, in the first mode, the control unit 30 controls the frequency control unit 42 so as to stop an operation of the frequency control unit 42.

In the second mode, the control unit 30 controls the first switching unit 21 so as to set an electrical connection state between the first terminal 11 and the third terminal 13 to the OFF state. In addition, in the second mode, the control unit 30 controls the second switching unit 22 so as to set an electrical connection state between the second terminal 12 and the fourth terminal 14 to the OFF state. Further, in the second mode, the control unit 30 controls the frequency control unit 42 so as to cause the normal operation of the frequency control unit 42.

Figure 4:
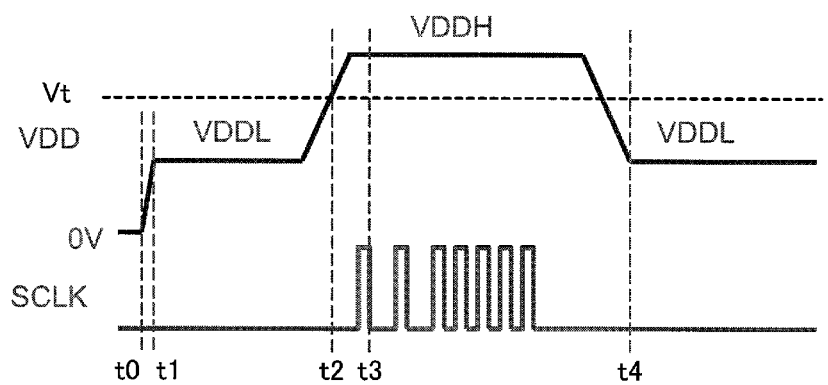
FIG. 4 is a timing chart for illustrating a mode switching operation of a control unit.

FIG. 4 is a timing chart for illustrating a mode switching operation of the control unit 30. In FIG. 4, a horizontal axis corresponds to time and a vertical axis corresponds to voltage. The timing chart at the upper portion of FIG. 4 indicates the power supply potential VDD supplied to the control unit 30, and the timing chart at the lower portion of FIG. 4 indicates the clock signal SCLK input to the control unit 30.

In the example shown in FIG. 4, the power supply potential VDD is 0 V at the time t0, a voltage VDDL at the time t1, and the reference value Vt at the time t2, and is increased to a voltage VDDH thereafter. The mode switching operation is started at the time t3 which is a time of increased pulse of the initial clock signal SCLK input in a period with the power supply potential VDD is the voltage VDDH, the first switching unit 21 and the second switching unit 22 are controlled to be the first mode, for example, based on the pulse of the clock signal SCLK thereafter, and the control unit 30 at the time t4 when the power supply potential VDD is returned to the voltage VDDL controls the first switching unit 21 and the second switching unit 22, to switch the mode to the second mode, for example.

According to the oscillation circuit 1 of the embodiment, since the control unit 30 performs switching of the mode based on the two signals of the magnitude of the power supply potential VDD and the clock signals SCLK, the mode is not switched by only the fluctuation of the power supply potential VDD, and accordingly, it is possible to reduce the possibility of the malfunction of unintentionally switching the mode.

In the case of the first mode, the control unit 30 may control the current source CS11 so as to stop the operation of the current source CS11 of the oscillation unit 10 or the oscillation unit 10a. Accordingly, it is possible to control the current supplied to the collector of the transistor M11 of the oscillation unit 10 or the oscillation unit 10a, and therefore it is possible to reduce the possibility of malfunction of the oscillation unit 10 or the oscillation unit 10a.

2. Oscillation Circuit According to Second Embodiment

Figure 5:
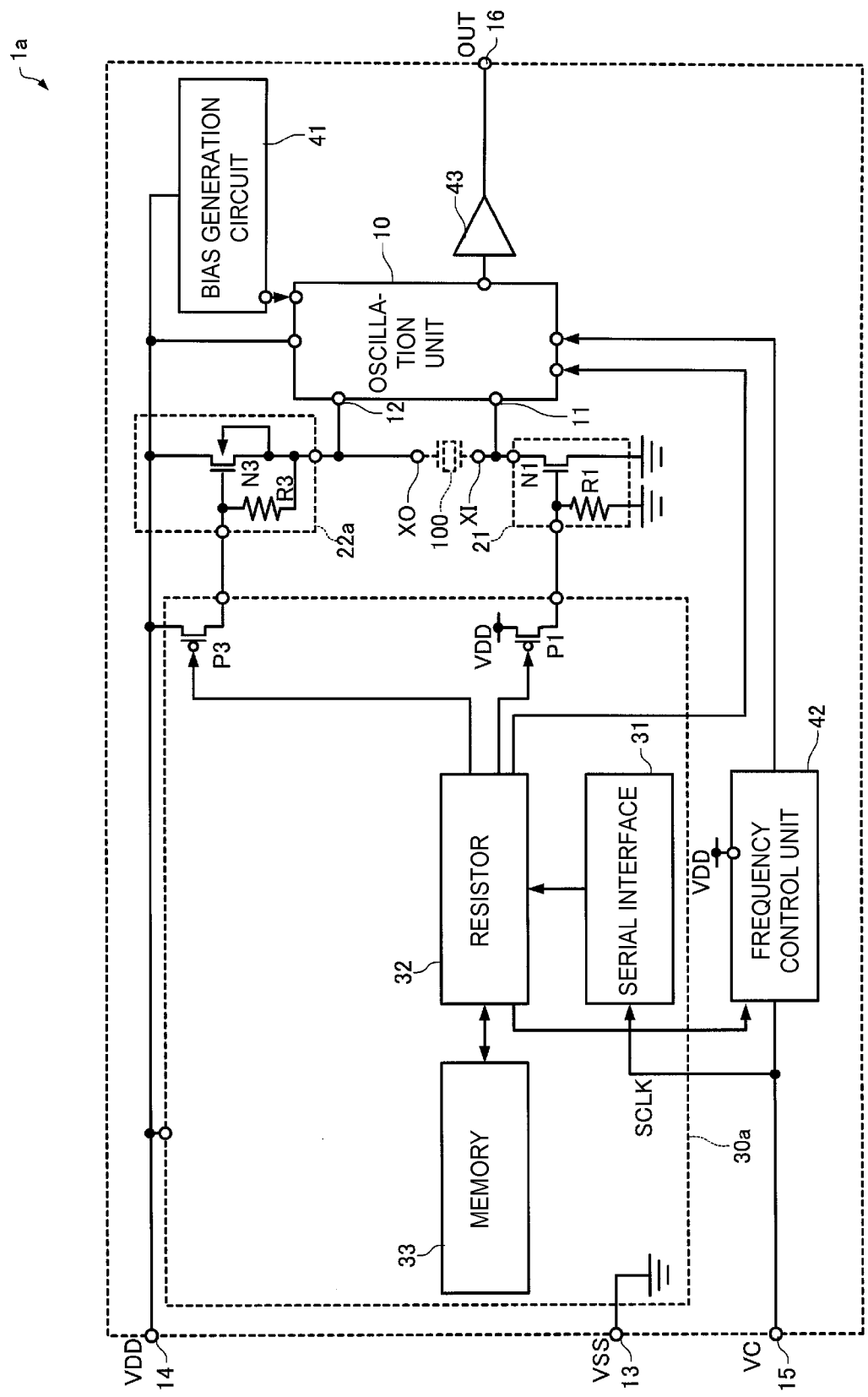
FIG. 5 is a circuit diagram of an oscillation circuit according to a second embodiment.

FIG. 5 is a circuit diagram of an oscillation circuit 1a according to a second embodiment. The same reference numerals are used for the same configuration as in the oscillation circuit 1 shown in FIG. 1, and specific description thereof will be omitted.

Different points of a control unit 30a of the oscillation circuit 1a according to the embodiment from the oscillation circuit 1 according to the first embodiment are a configuration of a second switching unit 22a and a configuration that a transistor for controlling the second switching unit 22a is a PMOS transistor P3, and the other configurations thereof are the same as those in the oscillation circuit 1.

As shown in FIG. 5, the second switching unit 22a may be a circuit (electrostatic discharge protection circuit) having a function of protecting the oscillation unit 10 from static electricity. In the example shown in FIG. 5, the second switching unit 22a includes an NMOS transistor N3 and a resistor R3, and functions as an electrostatic discharge protection circuit with respect to the oscillation unit 10 or the resonator 100 on the second terminal 12 side.

A drain of the NMOS transistor N3 is connected to the fourth terminal 14 and a source and a back gate thereof are connected to the second terminal 12. One end (one terminal) of the resistor R1 is connected to a gate of the NMOS transistor N3 and the other end (other terminal) thereof is connected to the second terminal 12. The control signal from the control unit 30a is input to the gate of the NMOS transistor N3, and the NMOS transistor N3 switches between an ON state and an OFF state based on the input control signal.

A drain of the PMOS transistor P3 is connected to the power supply potential VDD, a source thereof is connected to the gate of the NMOS transistor N3 of the second switching unit 22, and the control signal from the resistor 32 is input to a gate thereof. The PMOS transistor P3 outputs the control signal to the gate of the NMOS transistor N3 of the second switching unit 22.

According to the oscillation circuit 1a of the embodiment, since the PMOS transistor P1 and the PMOS transistor P3 can be controlled with an in-phase control signal, an inverter circuit or the like (not shown) for generating a reversed-phase control signal is not necessary. Therefore, it is possible to reduce a circuit size. In addition, with the oscillation circuit 1a, the same effects as those of the oscillation circuit 1 according to the first embodiment are obtained for the same reasons.

3. Oscillator

Figure 6:
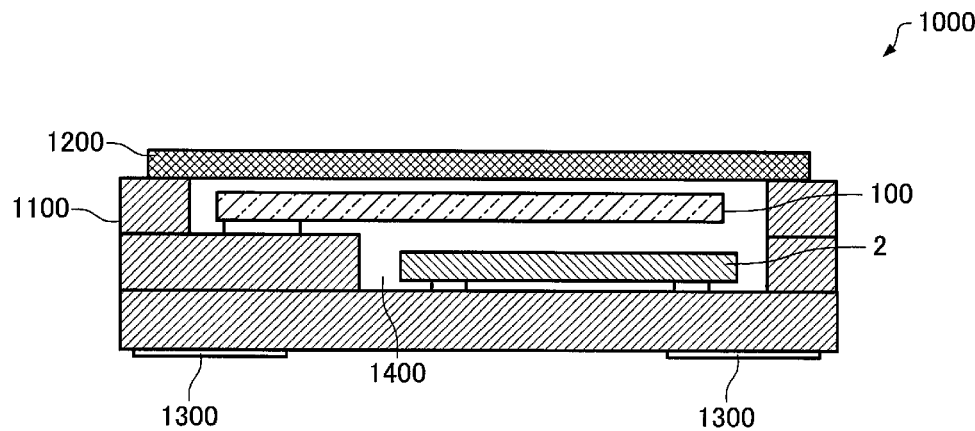
FIG. 6 is a cross-sectional view of an oscillator according to the embodiment.

FIG. 6 is a cross-sectional view of an oscillator 1000 of the embodiment. The oscillator 1000 includes an electronic component 2 and the resonator 100 configuring the oscillation circuit 1. In the example shown in FIG. 6, the oscillator 1000 includes a package 1100 which accommodates the electronic component 2 and the resonator 100 in the same space. In the example shown in FIG. 6, the oscillator 1000 includes a cover 1200 and electrodes 1300. In the example shown in FIG. 6, the electronic component 2 is configured as a one-chip semiconductor device. In addition, as the resonator 100, a piezoelectric resonator such as, a crystal resonator or a SAW resonator, or an MEMS resonator may be used.

A recess is provided in the package 1100, and an accommodation chamber 1400 is provided by covering the recess with the cover 1200. In the package 1100, wires and terminals for electrically connecting the oscillation circuit 1 and the resonator 100 to each other are provided on the surface of the recess or in the package 1100. In addition, the electrodes 1300 electrically connected to the third terminal 13 (VSS), the fourth terminal 14 (VC), the fifth terminal 15 (VDD), and the sixth terminal 16 (OUT) of the oscillation circuit 1 are provided on the package 1100.

Figure 7:
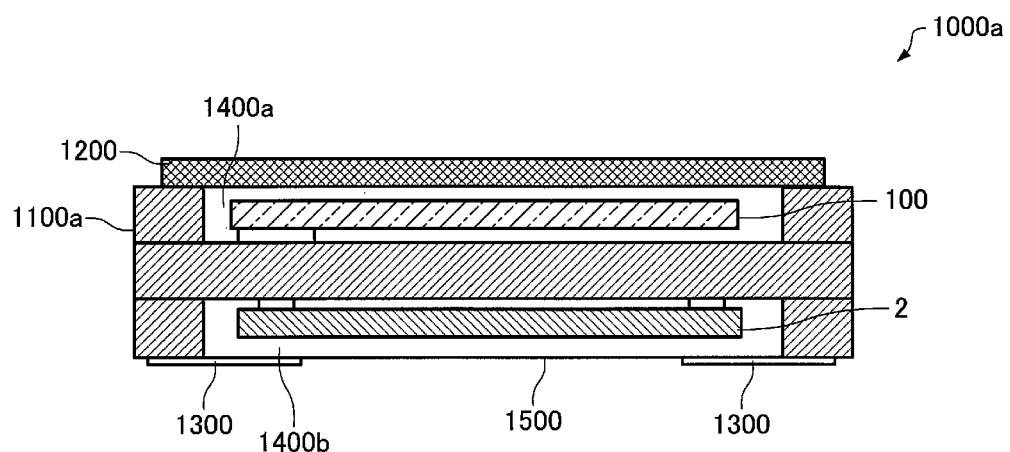
FIG. 7 is a cross-sectional view of an oscillator of a modification example of the embodiment.

FIG. 7 is a cross-sectional view of an oscillator 1000a of a modification example. The oscillator 1000a includes the electronic component 2 and the resonator 100 configuring the oscillation circuit 1. In the example shown in FIG. 7, the oscillator 1000a includes a package 1100a which accommodates the electronic component 2 and the resonator 100 in the same space. In the example shown in FIG. 7, the oscillator 1000a includes the cover 1200, the electrodes 1300 and a sealing member 1500. In the example shown in FIG. 7, the electronic component 2 is configured as one-chip semiconductor device. In addition, as the resonator 100, a piezoelectric resonator such as, a crystal resonator or a SAW resonator, or an MEMS resonator may be used.

In the package 1100a, two recesses are provided on opposing surfaces, an accommodation chamber 1400a is provided by covering one of the recesses by the cover 1200, and an accommodation chamber 1400b is provided by covering one of the recesses with the sealing member 1500. In the example shown in FIG. 7, the resonator 100 is accommodated in the accommodation chamber 1400a, and the electronic component 2 is accommodated in the accommodation chamber 1400b. In the package 1100a, wires and terminals for electrically connecting the oscillation circuit 1 and the resonator 100 to each other are provided on the surface of the recesses or in the package 1100a. In addition, the electrodes 1300 electrically connected to the third terminal 13 (VSS), the fourth terminal 14 (VC), the fifth terminal 15 (VDD), and the sixth terminal (OUT) of the oscillation circuit 1 are provided on the package 1100a.

According to the oscillator 1000 and the oscillator 1000a of the embodiment, since the oscillation circuit 1 with improved reliability in the inspection of the resonator 100 is provided, it is possible to realize the oscillator 1000 and the oscillator 1000a with improved reliability in the inspection of the resonator 100. The same effects described above are also obtained for the same reasons, even when oscillation circuit 1a is used instead of the oscillation circuit 1.

4. Manufacturing Method of Oscillator

Figure 8:
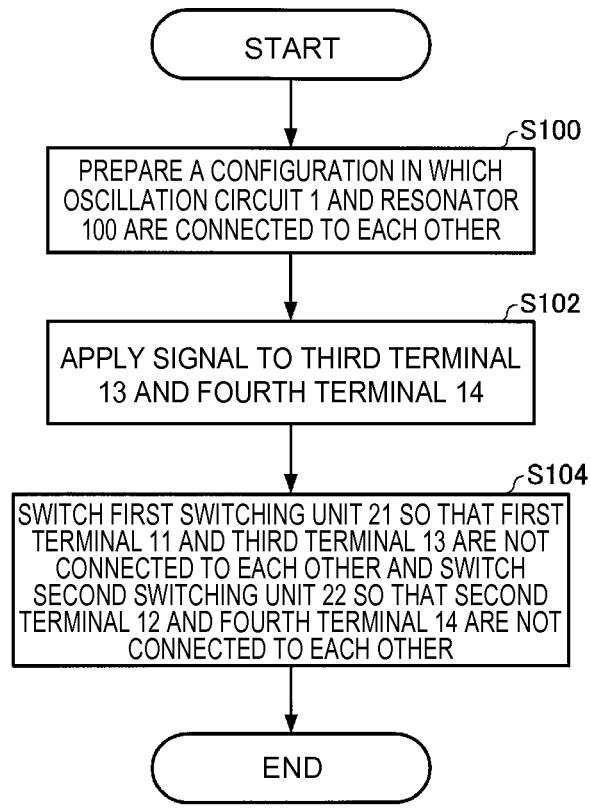
FIG. 8 is a flowchart showing a manufacturing method of an oscillator according to the embodiment.

FIG. 8 is a flowchart showing a manufacturing method of the oscillator 1000 according to the embodiment.

The manufacturing method of the oscillator 1000 according to the embodiment includes: preparing a configuration of including the oscillation circuit 1 including the oscillation unit 10 which includes first terminal 11 and the second terminal 12 connected to the resonator 100, the third terminal 13, the fourth terminal 14 to which the power supply potential VDD is supplied, the first switching unit 21 which switches modes of electrical connection between the first terminal 11 and the third terminal 13, and the second switching unit 22 which switches modes of electrical connection between the second terminal 12 and the fourth terminal 14, and the resonator 100, in which the oscillation circuit 1 and the resonator 100 are electrically connected to each other, the first switching unit 21 is switched so as to electrically connect the first terminal 11 and the third terminal 13 to each other, and the second switching unit 22 is switched so as to electrically connect the second terminal 12 and the fourth terminal 14 to each other; applying a signal to the third terminal 13 and the fourth terminal 14; and switching the first switching unit 21 so as not to electrically connect the first terminal 11 and the third terminal 13 to each other, and switching the second switching unit 22 so as not to electrically connect the second terminal 12 and the fourth terminal 14 to each other.

First, a configuration in which the oscillation circuit 1 and the resonator 100 are electrically connected to each other, the first switching unit 21 is switched so as to electrically connect the first terminal 11 and the third terminal 13 to each other, and the second switching unit 22 is switched so as to electrically connect the second terminal 12 and the fourth terminal 14 to each other (preparation step; step S100) is prepared. More specifically, a configuration in which the resonator 100 is electrically connected between the first terminal 11 and the second terminal 12 of the oscillation circuit 1 is prepared. For example, the control unit 30 may set the mode of the oscillation circuit 1 to the first mode after connecting the oscillation circuit 1 to the resonator 100, and the oscillation circuit 1 whose mode is set to the first mode by the control unit 30 in advance may be connected to the resonator 100.

After step S100, a signal is applied to the third terminal 13 and the fourth terminal 14 (signal applying step; step S102).

Figure 9:
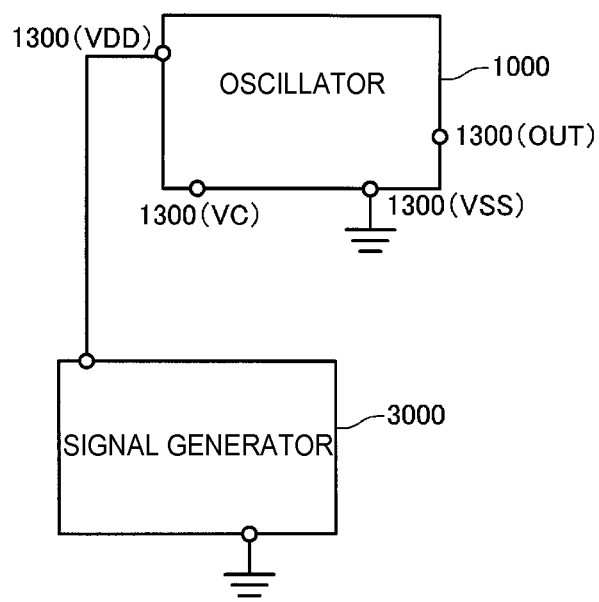
FIG. 9 is a block diagram showing the outline of a signal applying step.

FIG. 9 is a block diagram showing an outline of the signal applying step. In the example shown in FIG. 9, the overdrive inspection of the resonator 100 is performed by using a signal generator 3000. The overdrive inspection of the resonator 100 may be performed by using an externally-attached oscillation circuit which can be resonated with the resonator 100, for example, a Colpitts oscillation circuit, instead of the signal generator 3000. The drive level inspection may be performed instead of the overdrive inspection, and the two inspections of the overdrive inspection and the drive level inspection may be performed.

The electrode 1300 (VDD) of the oscillator 1000 electrically connected to the fourth terminal 14 (VDD) of the oscillation circuit 1 is connected to an output terminal of the signal generator 3000. The electrode 1300 (VSS) of the oscillator 1000 electrically connected to the third terminal 13 (VSS) of the oscillation circuit 1 is connected to the earth potential VSS. The electrode 1300 (VC) of the oscillator 1000 electrically connected to the fifth terminal 15 (VC) of the oscillation circuit 1, and the electrode 1300 (VC) of the oscillator 1000 electrically connected to the sixth terminal 16 (OUT) of the oscillation circuit 1 are not connected to any of the elements.

A voltage signal output by the signal generator 3000 is equal to or greater than a minimum voltage (for example, minimum operation voltage of the transistor) which can control the first switching unit 21 and the second switching unit 22, and a voltage equal to or smaller than a maximum voltage (for example, a withstand voltage of the transistor) not damaging the oscillation circuit 1 and is a voltage signal applied between the third terminal 13 and the fourth terminal 14.

With the configuration shown in FIG. 9, it is possible to apply the voltage signal between the third terminal 13 and the fourth terminal 14. Accordingly, it is possible to perform the inspection of the characteristics of the resonator 100 such as overdrive inspection or drive level inspection.

After step S102, the first switching unit 21 is controlled so that the first terminal 11 and the third terminal 13 are not electrically connected to each other, and the second switching unit 22 is controlled so that the second terminal 12 and the fourth terminal 14 are not electrically connected to each other (switching step; step S104). Specifically, the first switching unit 21 and the second switching unit 22 are controlled by the control unit 30 in order to switch the mode to the second mode. Accordingly, the oscillator 1000 can be constantly operated.

According to the manufacturing method of the oscillator 1000 of the embodiment, by supplying the voltage signal for inspecting the resonator 100 between the third terminal 13 and the fourth terminal 14 in the signal applying step (step S102), it is possible to perform the inspection of the characteristics of the resonator 100 such as overdrive inspection or drive level inspection. At the time of the normal operation of the oscillation circuit 1 and the inspection of the resonator 100, the fourth terminal 14 can be commonly used as a terminal to which the power supply potential VDD is supplied and a terminal to which a voltage signal for inspecting the resonator 100 is supplied, and accordingly it is possible to reduce the number of terminals used in the inspection, compared to a case of providing an inspecting terminal dedicated to the inspection, for example. Thus, it is possible to reduce the possibility of occurrence of inspection malfunction due to failure in the electrical connection between a probe for inputting an inspecting signal and a terminal on the oscillation circuit 1 side, and therefore, it is possible to realize the manufacturing method of the oscillator 1000 with improved reliability in the inspection of the resonator 100.

In the manufacturing method of the oscillator 1000 described above, the signal applied to the third terminal 13 and the fourth terminal 14 in the signal applying step (step S102) may be at least one of the signal for overdrive inspection and the signal for drive level inspection.

Since at least one of the overdrive inspection and the drive level inspection is performed as the inspection of the resonator 100, it is possible to determine that the oscillator 1000 confirmed as a good product in the inspection of the resonator 100, is a good product, and accordingly, it is possible to manufacture the oscillator 1000 with high reliability.

The same effects described above are also obtained for the same reasons, even when oscillation circuit 1a is used instead of the oscillation circuit 1. In addition, it is also possible to manufacture the oscillator 1000a in the same manner as the oscillator 1000, and the same effects described above are obtained.

5. Electronic Device

Figure 10:
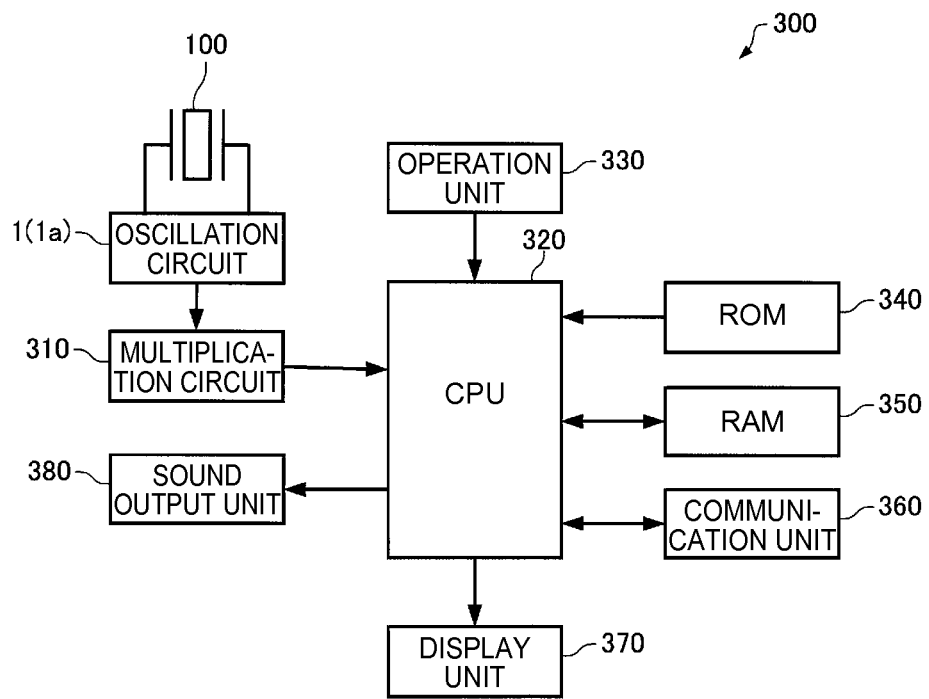
FIG. 10 is a functional block diagram of an electronic device according to the embodiment.

FIG. 10 is a functional block diagram of the electronic device 300 according to the embodiment. The same reference numerals are used for the same configuration as in the embodiments described above, and specific description thereof will be omitted.

An electronic device 300 according to the embodiment is the electronic device 300 including the oscillation circuit 1, the oscillation circuit 1a, the oscillator 1000, or the oscillator 1000a. In the example shown in FIG. 10, the electronic device 300 includes the resonator 100, the oscillation circuit 1, a multiplication circuit 310, a central processing unit (CPU) 320, an operation unit 330, a read only memory (ROM) 340, a random access memory (RAM) 350, a communication unit 360, a display unit 370, and a sound output unit 380. In the electronic device 300 according to the embodiment, some of the constituent elements (units) shown in FIG. 9 may be omitted or modified, and the other constituent elements may be added.

The multiplication circuit 310 supplies a clock pulse to not only the CPU 320 (not shown) but also to each unit. The clock pulse may be a signal which is obtained by extracting a desirable harmonic signal from an oscillation signal from the oscillation circuit 1 connected to the resonator 100 by the multiplication circuit 310, or may be a signal obtained by multiplying the oscillation signal from the oscillation circuit 1 by the multiplication circuit 310 including a PLL synthesizer (not shown).

The CPU 320 performs various calculation processes or control processes by using the clock pulse output by the multiplication circuit 310, according to a program stored in the ROM 340 or the like. Specifically, the CPU 320 performs various processes according to an operation signal from the operation unit 330, a process of controlling the communication unit 360 for performing data communication with the outside, a process of transmitting a display signal for displaying various information items on the display unit 370, and a process of outputting various sounds to the sound output unit 380.

The operation unit 330 is an input device configured with an operation key or a button switch, and outputs the operation signal to the CPU 320 according to the operation performed by a user.

The ROM 340 stores a program or data allowing the CPU 320 to perform various calculation processes or control processes.

The RAM 350 is used as an operation area of the CPU 320, and temporarily stores a program or data read out from the ROM 340, data input from the operation unit 330, and an operation result executed according to various programs by the CPU 320.

The communication unit 360 performs various controls for satisfying data communication between the CPU 320 and an external device.

The display unit 370 is a display device configured with a liquid crystal display (LCD) or an electrophoretic display, and displays various information items based on a display signal input from the CPU 320.

The sound output unit 380 is a device such as a speaker which outputs sound.

According to the electronic device 300 of the embodiment, since the oscillation circuit 1, the oscillation circuit 1a, the oscillator 1000, or the oscillator 1000a with improved reliability in the inspection of the resonator 100 are included, it is possible to realize the electronic device 300 with high reliability.

Various electronic devices are considered as the electronic device 300. For example, a personal computer (for example, a mobile-type personal computer, a laptop-type personal computer, or a tablet-type personal computer), a moving object terminal such as a mobile phone, a digital still camera, an ink jet type discharging apparatus (for example, ink jet printer), a storage area network apparatus such as a router or a switch, a local area network apparatus, an apparatus for moving object terminal base station, a television, a video camera, a video recorder, a car navigation apparatus, a pager, an electronic organizer (including a communication function), an electronic dictionary, a calculator, an electronic game device, a game controller, a word processor, a work station, a video phone, a security monitor, electronic binoculars, a POS (point of sale) terminal, medical equipment (for example, an electronic thermometer, a blood pressure meter, a blood glucose meter, an ECG measuring device, a ultrasound diagnostic device, an electronic endoscope), a fishfinder, a variety of measurement equipment, a meter (for example, meters for vehicles, aircraft, ships), a flight simulator, a head mounted display, motion tracing, motion tracking, a motion controller, PDR (pedestrian position and azimuth measurement), and the like.

Figure 11:
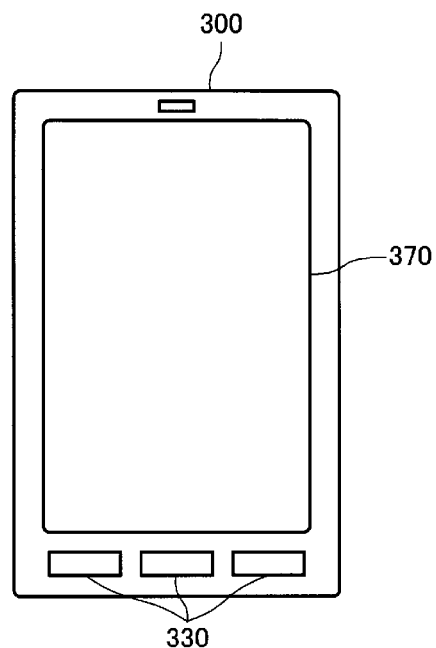
FIG. 11 is a diagram showing an example of the appearance of a smart phone which is an example of an electronic device.

FIG. 11 is a diagram showing an example of the appearance of a smart phone which is an example of the electronic device 300. The smart phone which is the electronic device 300 includes buttons as the operation unit 330 and an LCD as the display unit 370. Since the smart phone which is the electronic device 300 includes the oscillation circuit 1, the oscillation circuit 1a, the oscillator 1000, or the oscillator 1000a, it is possible to realize the electronic device 300 with improved reliability in the inspection of the resonator 100.

6. Moving Object

Figure 12:
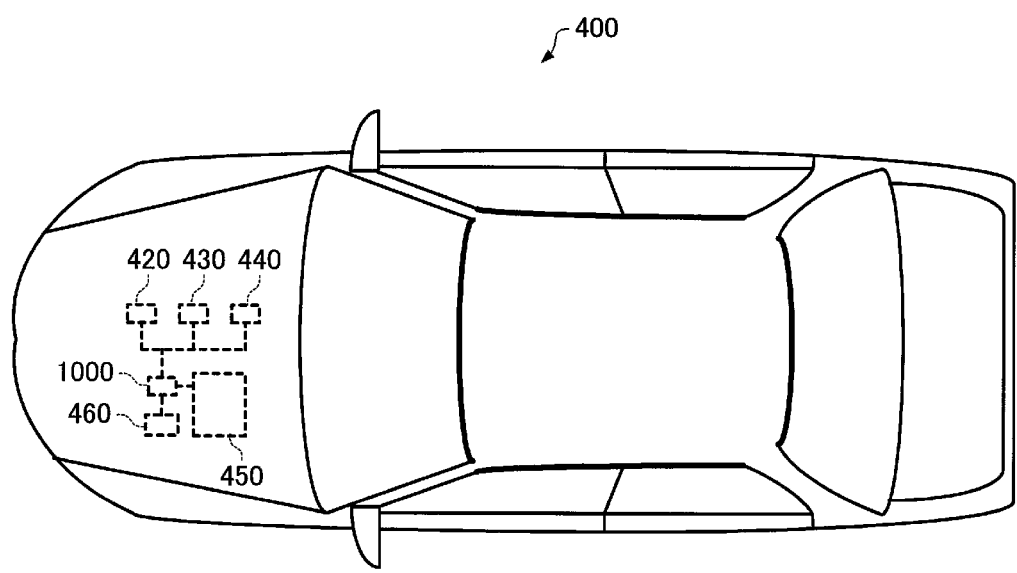
FIG. 12 is a diagram (top view) showing an example of a moving object according to the embodiment.

FIG. 12 is a diagram (top view) showing an example of a moving object 400 according to the embodiment. The same reference numerals are used for the same configuration as in the embodiments described above, and specific description thereof will be omitted.

The moving object 400 according to the embodiment is a moving object 400 including the oscillation circuit 1, the oscillation circuit 1a, the oscillator 1000, or the oscillator 1000a. FIG. 12 shows the moving object 400 including the oscillator 1000. In the example shown in FIG. 12, the moving object 400 includes a controller 420, a controller 430, and a controller 440 which performs various controls of an engine system, a brake system, and a keyless entry system, and a battery 450, and a backup battery 460. In the moving object 400 according to the embodiment, some of the constituent elements (units) shown in FIG. 12 may be omitted or modified, and other constituent elements may be added.

According to the moving object 400 of the embodiment, since the oscillation circuit 1, the oscillation circuit 1a, the oscillator 1000, or the oscillator 1000a with improved reliability in the inspection of the resonator 100 are included, it is possible to realize the moving object 400 with high reliability.

Various moving objects are considered as the moving object 400, for example a vehicle (including an electric vehicle), an aircraft such as a jet or a helicopter, a ship, a rocket, or a satellite.

The embodiments or modification examples have been described, but the invention is not limited to the embodiments or modification examples, and the invention can be realized with various embodiments within a range not departing from a scope thereof.

The invention includes substantially the same configuration as the configuration described in the embodiments (for example, a configuration having the same functions, methods, and results, or a configuration having the same object and effects). The invention includes a configuration obtained by replacing the non-essential parts of the configuration described in the embodiments. The invention includes a configuration for realizing the same operation effects or a configuration for reaching the same object as the configuration described in the embodiments. The invention includes a configuration obtained by adding the related art to the configuration described in the embodiments.

The entire disclosure of Japanese Patent Application No. 2013-225999, filed Oct. 30, 2013 is expressly incorporated by reference herein.

What is claimed is:

1. An oscillation circuit comprising:
   an oscillation unit that includes a first terminal and a second terminal connected to a resonator;
   a third terminal;
   a fourth terminal to which at least one of a power supply potential and an AC voltage for driving the resonator is applied;
   a first switching unit that switches modes of electrical connection between the first terminal and the third terminal;
   a second switching unit that switches modes of electrical connection between the second terminal and the fourth terminal; and
   a control unit that controls the first switching unit and the second switching unit in a first mode and a second mode, wherein
   in the first mode, the first terminal and the third terminal are electrically connected to each other by the first switching unit and the second terminal and the fourth terminal are electrically connected to each other by the second switching unit,
   in the second mode, the first terminal and the third terminal are electrically disconnected by the first switching unit and the second terminal and the fourth terminal are electrically disconnected by the second switching unit,
   the first mode is an inspection mode having an irregular oscillation,
   the second mode provides a regular oscillation, and
   the control unit switches the mode from the second mode to the first mode, based on a clock signal input in a period in which the supplied power supply potential is equal to or greater than a reference value.

2. The oscillation circuit according to claim 1,
   wherein the third terminal is a terminal connected to an earth potential.

3. The oscillation circuit according to claim 1,
   wherein the first switching unit is a circuit including a function of protecting the oscillation unit from a voltage higher than a maximum voltage applied to the first terminal in a state where the oscillation unit is operated.

4. The oscillation circuit according to claim 1,
   wherein the second switching unit is a circuit including a function of protecting the oscillation unit from a voltage higher than a maximum voltage applied to the second terminal in a state where the oscillation unit is operated.

5. The oscillation circuit according to claim 1,
   wherein the first terminal is electrically connected to an input terminal side of the oscillation unit.

6. The oscillation circuit according to claim 1,
   wherein the first switching unit includes a transistor.

7. The oscillation circuit according to claim 1,
   wherein the second switching unit includes a transistor.

8. An oscillator comprising:
   the oscillation circuit according to claim 1; and
   the resonator.

9. The oscillator according to claim 8, further comprising:
   a package which accommodates the oscillation circuit and the resonator.

10. An electronic device comprising the oscillation circuit according to claim 1.

11. A moving object comprising the oscillation circuit according to claim 1.

12. A manufacturing method of an oscillator, comprising:
    preparing a configuration including an oscillation circuit including an oscillation unit that includes a first terminal and a second terminal connected to a resonator, a third terminal, a fourth terminal to which a power supply potential is applied, a first switching unit that switches modes of electrical connection between the first terminal and the third terminal, a second switching unit that switches modes of electrical connection between the second terminal and the fourth terminal, a control unit that controls the first switching unit and the second switching unit in a first mode and a second mode, and the resonator, in which the oscillation unit and the resonator are electrically connected to each other, wherein, in the first mode, the first switching unit is switched so as to electrically connect the first terminal and the third terminal to each other and the second switching unit is switched so as to electrically connect the second terminal and the fourth terminal to each other;
    applying an AC voltage to the third terminal and the fourth terminal; and
    switching, by the control unit, from the first mode to the second mode, wherein in the second mode, the first switching unit electrically disconnects the first terminal and the third terminal, and the second switching unit electrically disconnects the second terminal and the fourth terminal, wherein:
    the first mode is an inspection mode having an irregular oscillation,
    the second mode is a non-inspection mode having a regular oscillation, and
    the control unit switches the mode from the second mode to the first mode, based on a clock signal input in a period in which the supplied power supply potential is equal to or greater than a reference value.

13. The manufacturing method of an oscillator according to claim 12,
    wherein the AC voltage applied to the third terminal and the fourth terminal is at least one of a voltage for overdrive inspection and a voltage for drive level inspection.

* * * * *